(12) United States Patent
Zhao et al.

(10) Patent No.: US 10,544,311 B2
(45) Date of Patent: Jan. 28, 2020

(54) POLYMERIC POWDER COMPOSITION FOR THREE-DIMENSIONAL (3D) PRINTING

(71) Applicant: Hewlett-Packard Development Company, L.P., Houston, TX (US)

(72) Inventors: Lihua Zhao, Sunnyvale, CA (US); Sivapackia Ganapathiappan, Los Altos, CA (US); Yan Zhao, Palo Alto, CA (US); Krzysztof Nauka, Palo Alto, CA (US); Howard S. Tom, San Jose, CA (US); Hou T. Ng, Campbell, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 846 days.

(21) Appl. No.: 15/100,603

(22) PCT Filed: Jan. 29, 2014

(86) PCT No.: PCT/US2014/013517
§ 371 (c)(1),
(2) Date: May 31, 2016

(87) PCT Pub. No.: WO2015/108544
PCT Pub. Date: Jul. 23, 2015

(65) Prior Publication Data
US 2016/0312037 A1    Oct. 27, 2016

(30) Foreign Application Priority Data

Jan. 16, 2014    (WO) .................. PCT/EP2014/050841

(51) Int. Cl.
| | | |
|---|---|---|
| *C09D 5/03* | (2006.01) |
| *C08L 101/00* | (2006.01) |
| *C08L 77/02* | (2006.01) |
| *C08L 77/06* | (2006.01) |
| *B29C 64/40* | (2017.01) |
| *B29C 64/386* | (2017.01) |
| *B29C 64/165* | (2017.01) |
| *B29C 64/00* | (2017.01) |
| *B33Y 10/00* | (2015.01) |
| *B33Y 30/00* | (2015.01) |
| *B33Y 50/00* | (2015.01) |
| *B33Y 50/02* | (2015.01) |
| *B33Y 70/00* | (2015.01) |
| *C08J 3/12* | (2006.01) |
| *C09D 177/02* | (2006.01) |
| *G06F 17/50* | (2006.01) |
| *B29K 77/00* | (2006.01) |
| *B29K 105/00* | (2006.01) |

(52) U.S. Cl.
CPC .............. *C09D 5/031* (2013.01); *B29C 64/00* (2017.08); *B29C 64/165* (2017.08); *B29C 64/386* (2017.08); *B29C 64/40* (2017.08); *B33Y 10/00* (2014.12); *B33Y 30/00* (2014.12); *B33Y 50/00* (2014.12); *B33Y 50/02* (2014.12); *B33Y 70/00* (2014.12); *C08J 3/12* (2013.01); *C08L 77/02* (2013.01); *C08L 77/06* (2013.01); *C08L 101/00* (2013.01); *C09D 177/02* (2013.01); *G06F 17/5009* (2013.01); *B29K 2077/00* (2013.01); *B29K 2105/251* (2013.01); *C08J 2377/02* (2013.01); *C08L 2205/025* (2013.01)

(58) Field of Classification Search
None
See application file for complete search history.

(56) References Cited

U.S. PATENT DOCUMENTS

| | | |
|---|---|---|
| 5,006,364 A | 4/1991 | Fan |
| 5,342,919 A | 8/1994 | Dickens, Jr. et al. |
| 5,514,519 A | 5/1996 | Neckers |
| 6,596,224 B1 | 7/2003 | Sachs et al. |
| 6,799,959 B1 | 10/2004 | Tochimoto et al. |

(Continued)

FOREIGN PATENT DOCUMENTS

| | | |
|---|---|---|
| CN | 1051627 | 5/1991 |
| CN | 1500608 | 6/2004 |

(Continued)

OTHER PUBLICATIONS

Akdemir, N.et al. "Synthesis and properties of 1,4-bis[N-(2-tolylsulphonylaminoethyl)]-1,4 diazacyclohexane bridged network polymeric phthalocyanines", Dyes & Pigments 69 2006.

(Continued)

*Primary Examiner* — Ana L. Woodward
(74) *Attorney, Agent, or Firm* — Dierker & Kavanaugh PC

(57) ABSTRACT

A polymeric powder composition for three-dimensional printing includes first, second, and third polymeric particles. The first particles, having a first average size, are present in an amount ranging from about 70 wt % to about 95 wt %. The second particles, having a second average size smaller than the first average size, are present in an amount ranging from about 0.5 wt % to about 21 wt %. The third particles, having a third average size smaller than the second average size, are present in an amount ranging from greater than 0 wt % up to about 21 wt %. Each of the first, second, and third average sizes independently ranges from 5 μm to about 100 μm. A sum of the fractional weight ratios of all of the polymeric particles in the polymeric powder composition equals 1.

10 Claims, 5 Drawing Sheets

(56) References Cited

U.S. PATENT DOCUMENTS

| | | | |
|---|---|---|---|
| 7,470,315 B2 | 12/2008 | Vonwiller et al. | |
| 7,559,983 B2 | 7/2009 | Starling et al. | |
| 7,674,423 B2 | 3/2010 | Sano | |
| 7,959,724 B2 | 6/2011 | Vonwiller et al. | |
| 8,047,251 B2 | 11/2011 | Khoshnevis | |
| 8,110,135 B2 † | 2/2012 | El-Siblani | |
| 8,142,860 B2 | 3/2012 | Vanmaele et al. | |
| 8,232,333 B2 † | 7/2012 | Haeger | |
| 2004/0200816 A1 | 10/2004 | Chung et al. | |
| 2005/0003189 A1 | 1/2005 | Bredt et al. | |
| 2005/0080191 A1* | 4/2005 | Kramer | C08F 8/00 525/191 |
| 2006/0018942 A1 | 1/2006 | Rowe et al. | |
| 2006/0258546 A1* | 11/2006 | Brannon | C09K 8/80 507/269 |
| 2007/0238056 A1 | 10/2007 | Baumann et al. | |
| 2007/0241482 A1 | 10/2007 | Giller et al. | |
| 2010/0244333 A1 | 9/2010 | Bedal et al. | |
| 2011/0130489 A1 | 6/2011 | Williams | |
| 2011/0204234 A1 | 8/2011 | Ganapathiappan | |
| 2012/0258250 A1 | 10/2012 | Rodgers | |
| 2016/0312022 A1 † | 10/2016 | Niessner | |

FOREIGN PATENT DOCUMENTS

| | | |
|---|---|---|
| CN | 103231513 | 8/2013 |
| EP | 0911142 | 4/1999 |
| EP | 1452298 | 9/2004 |
| EP | 1505111 | 2/2005 |
| EP | 2463081 | 6/2012 |
| JP | 6135915 | 2/1986 |
| WO | WO 9501257 | 1/1995 |
| WO | WO 0140874 | 6/2001 |
| WO | WO 2006/091842 | 8/2006 |
| WO | WO2007147625 | 12/2007 |
| WO | WO 2008/151063 | 12/2008 |
| WO | WO 2013021173 | 2/2013 |
| WO | WO 2013/030064 | 3/2013 |
| WO | WO 2013090174 | 6/2013 |

OTHER PUBLICATIONS

Goodridge, R.D. et al., Laser Sintering of Polyamides and Other Polymers (Research Paper), Progress in Materials Science, Feb. 2012, pp. 229-267, vol. 57, Issue 2.

International Search Report and Written Opinion for International Application No. PCT/EP2014/050841 dated Sep. 25, 2014, 12 pages.

International Search Report and Written Opinion for International Application No. PCT/US2014/013511 dated Oct. 15, 2014, 9 pages.

International Search Report and Written Opinion for International Application No. PCT/US2014/013517 dated Oct. 23, 2014, 11 pages.

Particle Design for Performance, Cabot Corporation, 1995-2013, 4pages http://www.cabot-corp.com/.

Wimpenny, D.I. et al.; "Selective Infrared Sintering of Polymeric Powders using Radiant IR Heating & Ink Jet Printing"; DeMontfort University, Sep. 14, 2006; 11 pages.

\* cited by examiner
† cited by third party

POLYMERIC POWDER COMPOSITION FOR THREE-DIMENSIONAL (3D) PRINTING

CROSS-REFERENCE TO RELATED APPLICATIONS

The present application claims the priority of International Application No. PCT/EP2014/050841 filed Jan. 16, 2014, the contents of which are hereby incorporated by reference.

BACKGROUND

Three-dimensional (3D) printing is an additive printing process used to make three-dimensional solid objects from a digital model. 3D printing is often used in rapid product prototyping, mold generation, and mold master generation. 3D printing techniques are considered additive processes because they involve the application of successive layers of material. This is unlike traditional machining processes, which often rely upon the removal of material to create the final object. Materials used in 3D printing often require curing or fusing, which for some materials may be accomplished using heat-assisted extrusion or sintering, and for other materials may be accomplished using digital light projection technology.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Examples of the polymeric powder composition disclosed herein include polymer particles with at least their type, size, and distribution rationally designed to obtain a three-dimensionally printed layer with a particular packing density (i.e., powder compaction). It is believed that in addition to optimizing the packing density, the rationally designed polymeric powder composition disclosed herein may also improve layer coating uniformity and reduce layer surface roughness, which may positively influence the physical attributes of the resulting 3D object. Optimizing the packing density may also reduce final physical shrinkage of the 3D object during the curing/fusing/sintering process.

In the examples disclosed herein, the rational design of the polymeric powder composition is determined using a computational modeling method, which creates a simulation cell of polymer particles based on input information, analyzes the energy and molecular dynamics of the simulation cell, and outputs a computationally determined packing density for the simulation cell. The computationally determined packing density, and the polymeric powder composition associated therewith, may be tuned by changing the information (e.g., the polymer type, size, size distribution, etc.) that is input into the computational model. The computational modeling method enables one to virtually screen a polymeric powder composition for a 3D object without having to test print different compositions in order to identify at least an initial composition for experimental development. This leads to a reduction in material usage and waste.

Figure 1:
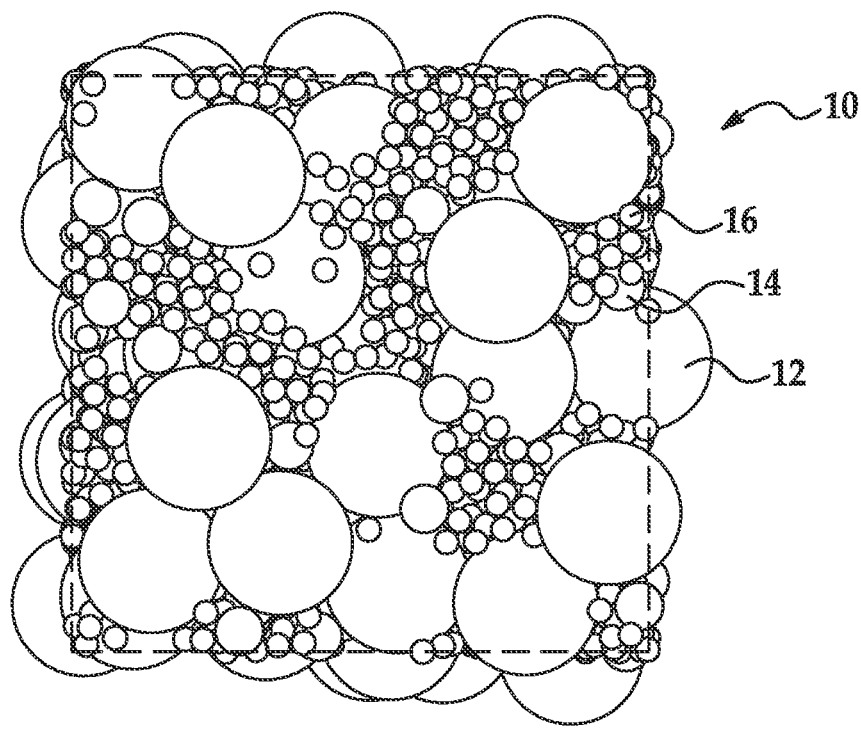
FIG. 1 is a front, perspective view of an example of a polymeric powder composition including differently sized particles.

Referring now to FIG. 1, an example of the polymeric powder composition 10 is shown. In this example, the composition 10 includes at least three differently sized polymer particles 12, 14, 16. While three differently sized polymer particles 12, 14, 16 are shown in FIG. 1, it is to be understood that any additional number of particles may be added. In general, a sum of the fractional weight ratios of all of the polymer particles 12, 14, 16, in the polymeric powder composition 10 equals one. When three differently sized particles are included, N100+B/100+C/100=1 (where A is the wt % of particle 12, B is the wt % of particle 14, and C is the wt % of particle 16). Similarly, if four differently sized particles were included, N100+B/100+C/100+D/100=1 (where A is the wt % of particle 12, B is the wt % of particle 14, C is the wt % of particle 16, and D is the wt % of the four particle (not shown)).

In the example shown in FIG. 1, the average size of the first polymer particle 12 is larger than the average size of the second polymer particle 14, and the average size of the second polymer particle 14 is larger than the average size of the third polymer particle 16. The term "size", as used herein, refers to the diameter of a spherical particle, or the average diameter of a non-spherical particle (i.e., the average of multiple diameters across the particle). In general, the average size of each of the first, second, and third particles ranges from 5 μm to about 100 μm. As an example of the different sizes for each of the particles 12, 14, 16, the average size of the first polymer particle 12 may be greater than 50 μm, the average size of the second polymer particle 14 may be between 10 μm and 30 μm, and the average size of the third polymer particle may be equal to or less than 10 μm. As more specific examples, one polymeric powder composition 10 includes first polymer particle 12 with an average size of 60 μm, second polymer particle 14 with an average size of 20 μm, and third polymer particle 16 with an average size of 10 μm, and another polymeric powder composition 10 includes first polymeric particle 12 with an average size of 50 μm, second polymer particle 14 with an average size of 25 μm, and third polymer particle 16 with an average size of 10 μm.

It is believed that the computational modeling method disclosed herein enables the polymeric powder composition 10 to have a relatively uniform statistical distribution of the particles 12, 14, 16. Through the computational modeling method, it has been found that a desirable tri-model polymeric powder composition 10 includes from about 70 wt % to about 95 wt % of the first polymer particle 12, from about 0.5 wt % to about 21 wt % of the second polymer particle 14, and from greater than 0 wt % up to about 21 wt % of the third polymer particle. The polymeric powder composition 10 having its particle size distribution within this range forms a layer of a 3D object with a desirable packing density (an example of which may range from about 0.4 g/ml to about 0.9 g/ml). It is to be understood, however, that the particle size distribution may be varied, for example, when the composition includes more than three different polymer particles.

The relatively uniform statistical distribution of particles 12, 14, 16 also leads to a statistically consistent porosity throughout the layer that is formed with the polymeric powder composition 10. The consistent porosity enables controlled penetration of subsequently deposited materials (e.g., a coalescent agent) into the layer of the polymeric powder composition 10, which can lead to improved and more efficient sintering, fusing, curing, etc. of the polymeric powder composition 10.

The respective particles 12, 14, 16 of the polymeric powder composition 10 may be formed of the same type of polymer, or of different types of polymers, or some of the particles 12, 14 may be formed of the same type of polymer and the other particles 16 may be formed of a different type of polymer. Examples of suitable polymers for the particles 12, 14, 16 include polyamides, polystyrene, polyethylene, polyacetals, polypropylene, polycarbonate, and blends of any two or more polymers.

In an example, the weight average molecular weight of the polymer used for each of the particles 12, 14, 16 may range from about 25,000 to about 300,000. For any of the polymers used in the polymeric particle composition, the polydispersity (i.e., the ratio of weight average molecular weight to number average molecular weight) may range from 1 to 4. The weight average molecular weight for the respective polymer particles 12, 14, 16 may be the same or different. In an example in which polymers with different weight average molecular weights are used, the particle 12 may be formed of a polymer having a weight average molecular weight ranging from about 45,000 to about 100,000, the particle 14 may be formed of a polymer having a weight average molecular weight of less than 45,000, and the particle 16 may be formed of a polymer having a weight average molecular weight of less than 30,000.

One or more of the particles 12, 14, 16 may be a core-shell polymer. A core-shell polymer includes an internal polymer particle (i.e., the core) which has a coating or layer (i.e., the shell) formed thereon. The core and shell of a single particle 12, 14, 16 may be different polymers (which have similar or different molecular weights), or may be the same type of polymer with different molecular weights. In an example, the core may be formed of a polymer having a high weight average molecular weight ranging from 70,000 to about 300,000, and the shell may be formed of a polymer having a low weight average molecular weight ranging from about 25,000 to less than 70,000. Examples of suitable core polymers include high molecular weight nylons, such as polyamide 12, polyamide 6, polyamide 8, polyamide 11, polyamide 66, and combinations thereof. Examples of suitable shell polymer include low molecular weight nylons such as polyamide 12. When polyamide 12 is selected for both the core and the shell, it is to be understood that the weight average molecular weight of the core ranges from about 70,000 to about 300,000 and the weight average molecular weight of the shell ranges from about 25,000 to less than 70,000. In still other examples, any of the low weight average molecular weight polymers may be selected as the core, and any of the high weight average molecular weight polymers may be selected as the shell. Examples of core-shell particles with different polymer type cores and shells include a shell of polyamide, and a core selected from polyether ketones, polycarbonates, acrylonitrile butadiene styrene (ABS) polymers, polyurethanes, and acylic polymers.

The shape of the particles 12, 14, 16 may also be the same or different. In an example, the particles 12, 14, 16 have spherical or near-spherical shapes. Particles 12, 14, 16 that have a sphericity of >0.84 are considered to be spherical or near-spherical in the examples disclosed herein. Thus, any particles 12, 14, 16 having a sphericity of <0.84 are non-spherical.

One or more of the particles 12, 14, 16 may also be physically modified, so that the surface topography of the particles 12, 14, and/or 16 is altered. Physical modifications may be accomplished using a milling process, a precipitation process, or a spraying deposition process, as will be described further below. In an example, the surface topography of the particles 12, 14, and/or 16 may be modified so that nodules are present at the respective surfaces of the particles 12, 14, 16 after the modification process is complete. Nodules are small protrusions/features that extend outward from the surface of the particle 12, 14, 16. Each nodule has a diameter or an average diameter ranging from about 50 nm to about 5 µm. It is believed that nodules present at the surfaces of the particles 12, 14, 16 may increase the contact surface area of the particles 12, 14, 16 with neighboring particles 12, 14, 16 in the polymeric particle composition 10, and thus may increase the efficiency of any sintering, fusing, curing process that is subsequently performed.

One or more of the particles 12, 14, and/or 16 may be chemically modified at the surface. Chemical surface modifications may be performed to improve the wetting of the polymeric powder composition 10 with subsequently deposited materials (i.e., to facilitate improved fluid interaction), and/or to enhance cross-linking between the particles 12, 14, 16 during sintering, fusing, curing, etc. (which enhances mechanical strength and elongation performance of the resulting 3D object).

It may be desirable to modify the wetting angle of the polymeric powder composition 10 to less than 45°. This wetting angle may increase the ability of subsequently deposited material(s) to penetrate into the layer formed with the polymeric powder composition 10. A wetting angle of less than 45° may be achieve by introducing chemical building blocks, such as hydroxyl groups, onto the surface of the particles 12, 14, and/or 16. In an example, hydroxyl groups may be introduced on the surface of the particles 12, 14, and/or 16 by treating the particles 12, 14, and/or 16 with hydroxyl containing compounds, such as glycerol, pentanediol, hexanediol, or pentaerythritol.

When the polymer particles 12, 14, 16 include carboxylic acid and/or amino functional groups at the surface, chemical modification may take place through these functional groups. In an example, the polymer particles 12, 14, 16 including the carboxylic acid and/or amino functional groups at the surface may be treated with an amino compound having the general structure RNH R'XR", where R is H or an alkyl group with 1 to 18 carbon atoms, R' is a divalent linking group (such as an alkylene or arylene), and XR" together is H or X is selected from O, COO, OCO, CONH, NHCO or CO and R" is selected from H or an alkyl group with 1 to 18 carbon atoms. During the treatment of the particle 12, 14, 16 with the amino compound, the corresponding salt(s) or amido group(s) can be formed on the surface of the particle 12, 14, 16. The addition of the salt(s) or amido group(s) at the surface of the particle(s) 12, 14, 16 may improve interlayer adhesion, enable better flow when the particle(s) 12, 14, 16 melts, and/or adjust the hydrophobicity of the 3D object that is formed.

In another example, the polymer particles 12, 14, 16 including the carboxylic acid and/or amino functional groups at the surface may be treated with an alcohol having the general structure of HOR'XR", where R' is a divalent linking group (e.g., an alkylene or arylene), XR" together is H or X is selected from O, COO, OCO, CONH, NHCO or CO and R" is selected from H or an alkyl group with 1 to 18 carbon atoms. During the treatment of the particle 12, 14, 16 with the alcohol, an ester group is formed on the surface of the particle 12, 14, 16. The addition of the ester group(s) at the surface of the particle(s) 12, 14, 16 may also improve interlayer adhesion, enable better flow when the particle(s) 12, 14, 16 melts, and/or adjust the hydrophobicity of the 3D object that is formed.

In still another example, the polymer particles 12, 14, 16 including the amino functional groups at the surface may be treated with chloro or alkoxy silanes. The general structure of a suitable silane is $YSi(R_2)R"$, where Y is Cl, $OCH_3$ or $OCH_2CH_3$, R is an alkyl or alkoxy group with 1 to 18 carbon atoms, and R" is an alkyl group with 1 to 18 carbon atoms or an alkyl group with substituent groups having 1 to 18 carbon atoms. Similar to salt(s), amido group(s), and ester group(s), the addition of the silane group(s) at the surface of the particle(s) 12, 14, 16 may improve interlayer adhesion, enable better flow when the particle(s) 12, 14, 16 melts, and/or adjust the hydrophobicity of the 3D object that is formed.

In still other examples, inorganic nanoparticles with good hydrophilicity can be incorporated into the polymer particles 12, 14, 16 and/or on the surface of the polymer particles 12, 14, 16. Examples of suitable inorganic nanoparticles include silica, alumina, zinc oxide, titanium oxide, or the like. The introduction of inorganic nanoparticles into and/or on the particle surface(s) may adjust the flowability of the polymeric powder composition 10 and the mechanical property of the 3D object that is formed.

While not shown in FIG. 1, it is to be understood that the polymeric powder composition 10 may include, in addition to the polymer particles 12, 14, 16, a charging agent, a flow aid, or combinations thereof. Charging agent(s) may be added to suppress tribo-charging. Examples of suitable charging agent(s) include aliphatic amines (which may be ethoxylated), aliphatic amides, quaternary ammonium salts (e.g., behentrimonium chloride or cocamidopropyl betaine), esters of phosphoric acid, polyethylene glycol esters, or polyols. Some suitable commercially available charging agents include HOSTASTAT® FA 38 (natural based ethoxylated alkylamine), HOSTASTAT® FE2 (fatty acid ester), and HOSTASTAT® HS 1 (alkane sulfonate), each of which is available from Clariant Int. Ltd.). In an example, the charging agent is added in an amount ranging from greater than 0 wt % to less than 5 wt % based upon the total wt % of the particles 12, 14, and 16.

Flow aid(s) may be added to improve the coating flowability of the polymeric powder composition 10. Flow aid(s) may be particularly desirable when the particles 12, 14, and/or 16 are less than 25 µm in size. The flow aid improves the flowability of the polymeric powder composition 10 by reducing the friction, the lateral drag, and the tribocharge buildup (by increasing the particle conductivity). Examples of suitable flow aids include tricalcium phosphate (E341), powdered cellulose (E460(ii)), magnesium stearate (E470b), sodium bicarbonate (E500), sodium ferrocyanide (E535), potassium ferrocyanide (E536), calcium ferrocyanide (E538), bone phosphate (E542), sodium silicate (E550), silicon dioxide (E551), calcium silicate (E552), magnesium trisilicate (E553a), talcum powder (E553b), sodium aluminosilicate (E554), potassium aluminium silicate (E555), calcium aluminosilicate (E556), bentonite (E558), aluminium silicate (E559), stearic acid (E570), or polydimethylsiloxane (E900). In an example, the flow aid is added in an amount ranging from greater than 0 wt % to less than 5 wt % based upon the total wt % of the particles 12, 14, and 16.

The polymeric powder composition 10 has a computationally predetermined packing density ranging from about 0.4 g/ml to about 0.9 g/ml. For 3D printing applications, a computationally predetermined packing density within this range achieves powder compaction that is sufficient to enhance subsequent sintering, fusing, curing etc., resulting in mechanically improved and more aesthetically pleasing 3D printed objects. In other examples, the computationally predetermined packing density ranges from about 0.4 g/ml to about 1 g/ml, or from about 0.5 g/ml to about 0.95 g/ml.

Figure 2:
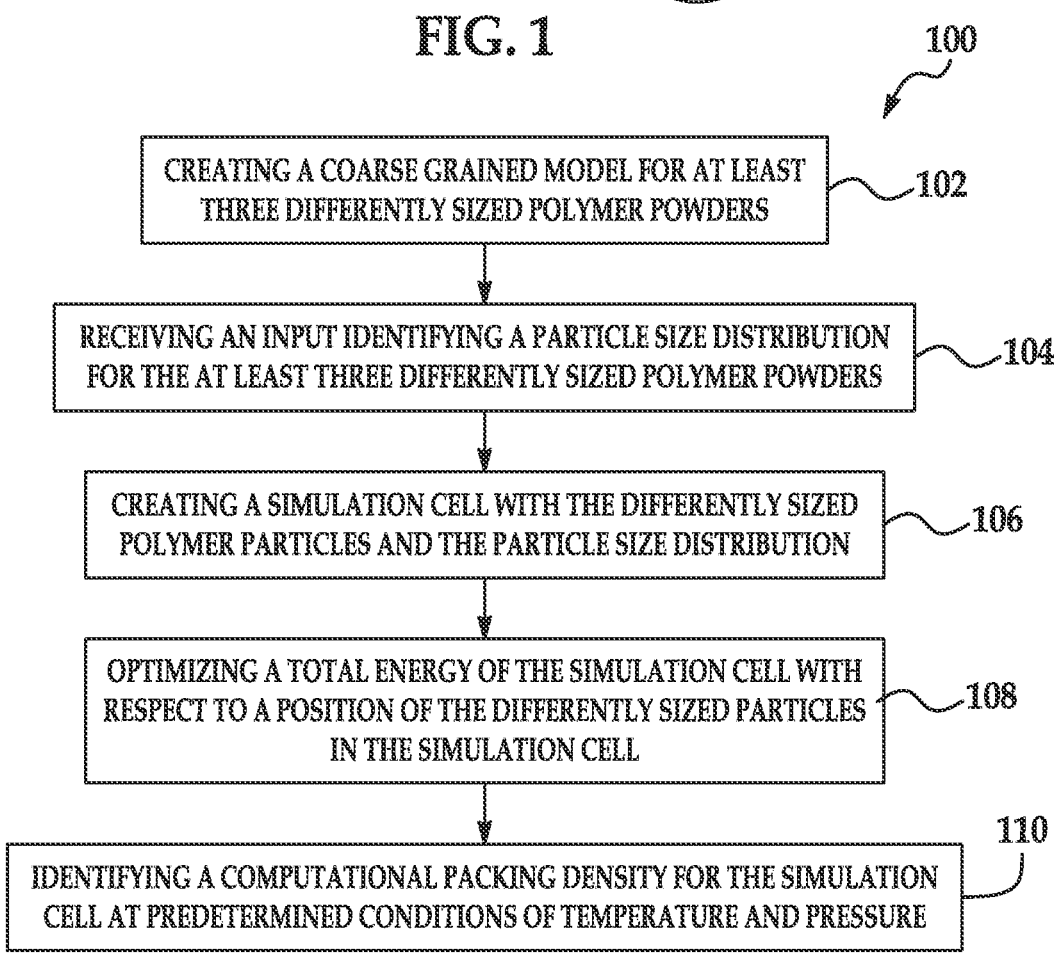
FIG. 2 is flow diagram illustrating an example of a computational modeling method as disclosed herein.

The computationally predetermined packing density may be identified for a particular set of particles 12, 14, 16 using the computational modeling method 100 disclosed herein (see FIG. 2). The computational modeling method 100 is performed by a computer (including hardware components, such as a processor) running/executing computer readable instructions that are stored on a non-transitory, tangible computer readable medium. In any of the examples disclosed herein, the computer readable medium may include any one of many physical media such as, for example, electronic, magnetic, optical, electromagnetic, or semiconductor media. More specific examples of suitable computer readable media include hard drives, a random access memory (RAM), a read-only memory (ROM), an erasable programmable read-only memory (EPROM), or a portable CD, DVD, or flash drive.

As an overview of the computational modeling method 100, the computer receives at least the structure of the polymers that are to be used for the particles 12, 14, 16 and the desired particle size distribution as input (e.g., from a user), and delivers at least the computationally predetermined packing density of a simulated layer simulated formed with a polymeric particle composition 10 that corresponds to the input polymer and size distribution information. More details of the computational modeling method 100 will be discussed in reference to FIG. 2.

As illustrated at reference numeral 102, the computer creates a coarse-grained model for at least three differently sized polymer particles 12, 14, 16. In order to create the coarse-grained model of each of the particles 12, 14, 16, the computer receives, as input from a user, the chemical structure or type of polymer to be used for each of the particles 12, 14, 16, and the size for each of the particles 12, 14, 16. As an example, the input may be that each of the particles 12, 14, 16 is to be polyamide 12 (i.e., $-[NH-(CH_2)_{11}-CO]_n-$, where n ranges from 50 to 2000), and that the respective sizes are to be 60 µm, 20 µm, and 10 µm. As another example, the input may be that each of the particles 12, 14, 16 is to be a core-shell particle with a high molecular weight polyamide 12 as the core and a low molecular weight polyamide 12 as the shell, and that the respective sizes are to be 50 µm, 25 µm, and 9 µm. The amount of information that is input will depend, at least in part, on the number of particles to be included in the polymeric particle composition 10. It is to be understood that the user may manually input the information (e.g., using a keyboard), or may select the polymer structure/type and particle size from preset menus.

The chemical structure or type may be used to derive an interaction parameter between the particles 12, 14, 16. More particularly, the chemical structures are utilized to derive the inter-particle forces, which depend on the interaction parameters between the particles. An algorithm of the computational model calculates the interaction parameters based on the chemical structures of the polymers.

The chemical structure or type may also be used to determine the intrinsic density of the respective polymer particles 12, 14, 16. For example, the computer may access a lookup table or may query a database to identify the intrinsic density of a polymer with that particular chemical structure or of that particular type, and having the identified size. Alternatively, the user may also input the intrinsic density of the particles 12, 14, 16 into the computer.

With the other initially input information, the user may also supply or select the desired particle size distribution for the differently sizes particles 12, 14, 16. Alternatively, if no particle size distribution is provided, the computer may prompt the user to select or input the desirable particle size distribution. As an example, the particle size distribution specifies the desired amount for each of the particles 12, 14, 16 to be included in the polymeric powder distribution 10. The amount may be identified as a weight percent (e.g., 80 wt % of particle 12, 6 wt % of particle 14, and 14 wt % of particle 16), a ratio (e.g., 80:6:14), or a fractional ratio (e.g., 80/100:6/100:14/100), or the like. The input identifying the particle size distribution is received by the computer, as shown at reference numeral 104.

After creating the coarse-grained model for each of the polymer particles 12, 14, 16 and receiving the particle size distribution, the computer creates a simulation cell with the specified differently sized polymer particles and in the specific particle size distribution, as shown at reference numeral 106 of FIG. 2. The simulation cell may look similar to the example shown in FIG. 1, where the smaller particles 14, 16 at least partially fill the voids between the larger particles 12. In an example, the dimensions of the simulation cell are about 250 μm by 250 μm 250 μm, although other dimensions may be used.

The computer then relaxes the simulation cell. Relaxation involves optimizing the total energy of the simulation cell by changing the position of the polymer particles 12, 14, 16 within the simulation cell, as shown at reference numeral 108. For optimization, the total energy of the simulation cell is minimized. The total energy of the simulation cell may change when the positioning of the particles 12, 14, 16 within the simulation cell changes. As such, the computer may be programmed to test different possible positions of the polymer particles 12, 14, 16 in order to identify different total energies that may be possible for the simulation cell. The interaction forces are used to calculate the forces and energies of the simulation cell. In an example, the computer may be programmed to search for the configuration (e.g., particle positioning) that corresponds with the lowest total energy.

After the total energy of the simulation cell is optimized, the molecular dynamics of the simulation cell at specific conditions (e.g., temperature and pressure) are analyzed by the computer. In an example, the temperature ranges from about 25° C. to about 250° C. and the pressure ranges from about 1 atm to about 10 atm. As an example, the computer simulates the isothermal-isobaric ensemble molecular dynamics for about 20,000 pico-seconds. After this simulation, the computer analyzes the simulation cell's parameters, including density, porosity, compaction, etc. to determine the computational packing density. To perform the analysis, an algorithm may be run that calculates the density of the final simulation system. The porosity and compaction of the final simulation cell (i.e., the packed polymer particles), in turn, are calculated based on the intrinsic density of the polymer(s).

If the resulting computational packing density is not desirable to the user or within a predefined range (e.g., from about 0.4 g/ml to about 0.9 g/ml), new information (e.g., particle size, distribution, etc.) may be input into the computer and the method 100 performed again with the updated information. If, however, the resulting computation packing density is desirable, the polymeric powder composition (based on the information input into the computer for the simulation) may be made and then used in a 3D printing method. The computational modeling method 100 takes into account intrinsic properties of the polymers, such as thermal conductivity, melting temperature, and crystallization temperature, and allows a user to identify particle sizes and a particle size distribution that will generate a polymeric powder composition 10 with a desirable packing density without having to make and test the actual composition 10.

Tables 1 and 2 below illustrate example packing density results for polyamide 12 particles of different sizes and at different distributions (given in wt %), as determined using the computational modeling method 100. The temperature used in the modeling method was 130° C.

TABLE 1

| wt % of 50 micron powders | wt % of 20 micron powders | wt % of 10 micron powders | pressure | packing density (g/ml) |
|---|---|---|---|---|
| 90 | 0.5 | 9.5 | 1 atm | 0.72 |
| 90 | 1 | 9 | 1 atm | 0.72 |
| 85 | 1.5 | 13.5 | 1 atm | 0.71 |
| 85 | 0.75 | 14.25 | 1 atm | 0.71 |
| 85 | 4.5 | 10.5 | 1 atm | 0.71 |
| 90 | 3 | 7 | 1 atm | 0.70 |
| 85 | 7.5 | 7.5 | 1 atm | 0.70 |
| 80 | 6 | 14 | 1 atm | 0.70 |
| 80 | 10 | 10 | 1 atm | 0.69 |
| 80 | 2 | 18 | 1 atm | 0.69 |
| 80 | 1 | 19 | 1 atm | 0.69 |
| 90 | 5 | 5 | 1 atm | 0.68 |
| 95 | 0.25 | 4.75 | 1 atm | 0.68 |
| 80 | 14 | 8 | 1 atm | 0.68 |
| 95 | 0.5 | 4.5 | 1 atm | 0.67 |
| 85 | 10.5 | 4.5 | 1 atm | 0.67 |
| 70 | 15 | 15 | 1 atm | 0.67 |
| 70 | 21 | 9 | 1 atm | 0.66 |
| 70 | 9 | 21 | 1 atm | 0.66 |

TABLE 2

| wt % of 50 micron powders | wt % of 25 micron powders | wt % of 10 micron powders | pressure | packing density (g/ml) |
|---|---|---|---|---|
| 90 | 0.5 | 9.5 | 1 atm | 0.67 |
| 85 | 0.75 | 14.25 | 1 atm | 0.67 |
| 85 | 1.5 | 13.5 | 1 atm | 0.67 |
| 90 | 1 | 9 | 1 atm | 0.66 |
| 85 | 4.5 | 10.5 | 1 atm | 0.66 |
| 80 | 6 | 14 | 1 atm | 0.66 |

TABLE 2-continued

| wt % of 50 micron powders | wt % of 25 micron powders | wt % of 10 micron powders | pressure | packing density (g/ml) |
|---|---|---|---|---|
| 80 | 2 | 18 | 1 atm | 0.66 |
| 80 | 1 | 19 | 1 atm | 0.65 |
| 90 | 3 | 7 | 1 atm | 0.65 |
| 80 | 10 | 10 | 1 atm | 0.65 |
| 85 | 7.5 | 7.5 | 1 atm | 0.65 |
| 70 | 15 | 15 | 1 atm | 0.64 |
| 70 | 9 | 21 | 1 atm | 0.64 |
| 70 | 21 | 9 | 1 atm | 0.63 |
| 90 | 5 | 5 | 1 atm | 0.63 |
| 95 | 0.25 | 4.75 | 1 atm | 0.63 |
| 80 | 14 | 6 | 1 atm | 0.63 |
| 95 | 0.5 | 4.5 | 1 atm | 0.63 |
| 85 | 10.5 | 4.5 | 1 atm | 0.62 |

The polymeric powder composition 10 may be formed by first performing the computational modeling method described in reference to FIG. 2 in order to determine the polymer type, size, size distribution, etc. for the particles 12, 14, 16 that will make up the composition 10.

In one example of the method of making the polymeric powder composition 10, the identified particles 12, 14, 16 (from the method 100) may be introduced (simultaneously or sequentially) into a powder mixer. Shear mixing or mechanical tumbling may be used to homogeneously mix the polymer particles 12, 14, 16. Mixing may be accomplished for any desirable time, and the final polymeric powder composition is obtained upon completion of the dry mixing process.

In another example of the method the polymeric powder composition 10, the identified particles 12, 14, 16 (from the method 100) may be introduced (simultaneously or sequentially) into an extruder. This may be a particularly suitable method when particles 12, 14, 16 of different polymer compositions are used. Shear extrusion may be used to homogeneously mix the polymer particles 12, 14, 16, and then milling or grinding methods may be used to obtain the desired particle morphology.

In either of the previous examples, it is to be understood that one or more sieving steps may be performed during the mixing process. This will selectively remove particles having average sizes that are larger than the pore size of the sieve or particles having average sizes that are smaller than the pore size of the sieve. In these instances, multiple polymeric powder compositions 10 may be obtained, each of which has polymer particles with discrete sizes. For example, if the original mixture contains polymer particles with seven different sizes, a sieve may be used to filter out the largest three particles to obtain two different polymeric particle compositions, one with three discrete particle sizes and the other with four discrete particle sizes.

When it is desirable to incorporate inorganic nanoparticles into the particles 12, 14, and/or 16, the inorganic nanoparticles may be introduced during the synthesis of the polymer particles 12, 14, and/or 16. When it is desirable to incorporate inorganic nanoparticles onto the surfaces of the particles 12, 14, and/or 16, the inorganic nanoparticles may be compounded with the polymer particles 12, 14, and/or 16. Compounding may be accomplished by cryo-milling, high shear milling, or grinding methods.

When it is desirable that all of the polymer particles 12, 14, and 16 be physically modified in the same manner, the mixed polymeric powder composition 10 may be subjected to a dry or wet milling process at a desired rpm. When a wet milling process is used, the physically modified polymeric powder composition 10 may be rinsed and dried, for instance, on a conveyor drying belt. During the dry or wet milling process, milling beads which have comparable sizes to the desired surface features of the particles 12, 14, and 16 are introduced.

Examples of other methods for performing physical modification of the particle 12, 14, and/or 16 include a precipitation process or a spraying deposition process. An example of the precipitation process includes dissolving, for example, the nylon polymer in a suitable solvent or solvent mixture (e.g., p-cresol or formic acid) at an elevated temperature, and then cooling the mixture, which forms the particles. This re-precipitation process can be carried out in a controlled fashion so that the surface morphology as well as the particle size can be tailored. An example of the spraying deposition process includes spraying dissolved or melted nylon polymer through small nozzles in order to obtain the particles. The nozzle size may be adjusted in order to control the particle size(s).

In other examples, if it is desirable that only some of the particles 12, 14 or 16 be physically modified, only the desired particle(s) 12, 14, or 16 may be subjected to the physical modification process. In still other examples, if it is desirable that the particles 12, 14, and 16 be physically modified in different manners from one another, the particle(s) 12, 14, and 16 may be subjected to separate physical modification processes. After completion of the physical modification process(es), the physically modified particles 12, 14, or 16 may be mixed with the other particles (e.g. non-modified particles or different physically modified particles) as previously described to form the polymeric particle composition 10.

When it is desirable that all of the polymer particles 12, 14, and 16 be chemically modified in the same manner, the mixed polymeric powder composition 10 may be exposed to a solution which contains the desired reactants (e.g., the previously mentioned amino compounds, alcohols, silanes, etc.). Upon completion of the reaction(s), the chemically modified polymeric powder composition may be rinsed and dried, for instance, on a conveyor drying belt. In other examples, if it is desirable that only some of the particles 12, 14, or 16 be chemically modified, only the desired particle(s) 12, 14, or 16 may be exposed to the solution which contains the desired reactants. In still other examples, if it is desirable that the particles 12, 14, and 16 be chemically modified in different manners from one another, the particle(s) 12, 14, and 16 may be subjected to separate solutions which contain the desired reactants. After completion of the reaction(s), the chemically modified particles 12, 14, or 16 may be mixed with the other particles (e.g. non-modified particles or different chemically modified particles) as previously described to form the polymeric particle composition 10.

When it is desirable that some of the particles 12, 14, 16 be physically and chemically modified, the previously described modification steps may be respectively performed, and then the modified and/or non-modified particles may be mixed together to form the polymeric particle composition 10.

The previously mentioned additives, such as a charging agent and/or flow aid, may be introduced during the synthesis of the polymer particles 12, 14, and/or 16, or may be blended in when the polymer particles 12, 14, and/or 16 are mixed together.

An example of the 3D printing method using an example of the polymeric powder composition 10 disclosed herein is shown in FIGS. 3A through 3E. This 3D printing method is a light area processing method. During light area processing, an entire layer of the polymeric powder composition 10 is exposed to radiation, but only a selected region of the polymeric powder composition 10 is fused and hardened to become a layer of a 3D object. In the examples disclosed herein, a coalescent agent is selectively deposited in contact with the selected region of the polymeric powder composition 10. The coalescent agent penetrates (partially or fully) into the layer of the polymeric powder composition 10. The coalescent agent is capable of absorbing radiation and converting the absorbed radiation to thermal energy, which in turn melts or sinters the particles 12, 14, 16 that are in contact with the coalescent agent. This causes the polymeric powder composition 10 to fuse, bind, cure, etc. to form the layer of the 3D object.

Figure 3A:
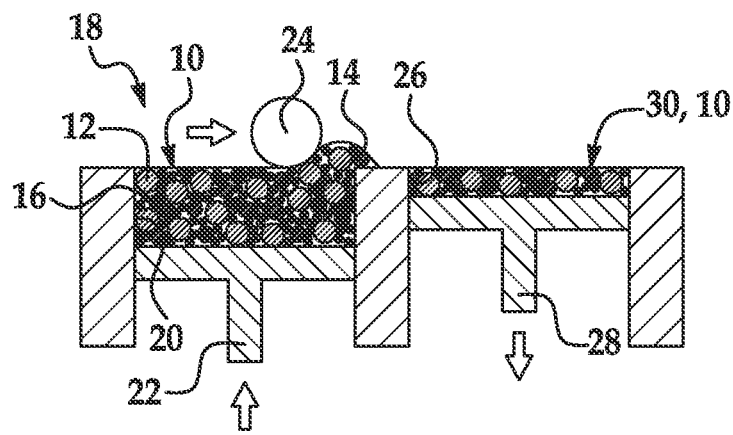
FIGS. 3A through 3E are cross-sectional views of the steps involved in forming one layer of a 3D object using an example of a 3D printing method as disclosed herein.

In the example shown in FIG. 3A, a printing system 18 for forming the 3D object includes a supply bed 20 (including a supply of the polymeric powder composition 10), a delivery piston 22, a roller 24, a fabrication bed 26, and a fabrication piston 28. Each of these physical elements may be operatively connected to a central processing unit (not shown) of the printing system 18. The central processing unit (e.g., running computer readable instructions stored on a non-transitory, tangible computer readable storage medium) manipulates and transforms data represented as physical (electronic) quantities within the printer's registers and memories in order to control the physical elements to create the 3D object. The data for the selective delivery of the polymeric powder composition 10, the coalescent agent, etc. may be derived from a model of the 3D object to be formed.

The delivery piston 22 and the fabrication piston 28 may be the same type of piston, but are programmed to move in opposite directions. In an example, when a first layer of the 3D object is to be formed, the delivery piston 22 may be programmed to push a predetermined amount of the polymeric powder composition 10 out of the opening in the supply bed 20 and the fabrication piston 28 may be programmed to move in the opposite direction of the delivery piston 22 in order to increase the depth of the fabrication bed 26. The delivery piston 22 will advance enough so that when the roller 24 pushes the polymeric powder composition 10 into the fabrication bed 26, the depth of the fabrication bed 26 is sufficient so that a layer 30 of the polymeric powder composition 10 may be formed in the bed 26. The roller 24 is capable of spreading the polymeric powder composition 10 into the fabrication bed 26 to form the layer 30, which is relatively uniform in thickness. In an example, the thickness of the layer 30 ranges from about 90 µm to about 110 µm, although thinner or thicker layers may also be used.

It is to be understood that the roller 24 may be replaced by other tools, such as a blade that may be desirable for spreading different types of powders.

Figure 3B:
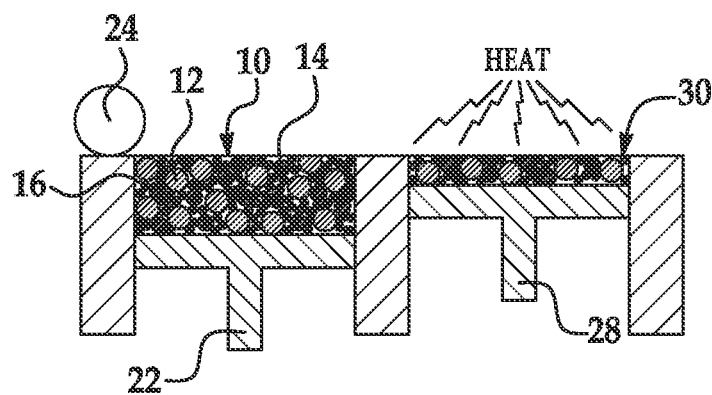

After the layer 30 of the polymeric powder composition 10 is deposited in the fabrication bed 26, the layer 30 is exposed to heating (as shown in FIG. 3B). Heating is performed to pre-heat the polymeric powder composition 10, and thus it is desirable that the heating temperature be below (e.g., from about 5° C. below to about 50° C. below) the lowest melting point of the polymer particles 12, 14, 16 in the polymeric powder composition 10. As such, the temperature selected will depend upon the polymeric powder composition 10 that is used. In an example, the heating temperature ranges from about 50° C. to about 350° C. In another example, the heating temperature ranges from about 60° C. to about 170° C.

Pre-heating the layer 30 of the polymeric powder composition 10 may be accomplished using any suitable heat source that exposes all of the polymeric powder composition 10 in the fabrication bed 26 to the heat. Examples of suitable heat sources include thermal or light radiation sources.

Figure 3C:
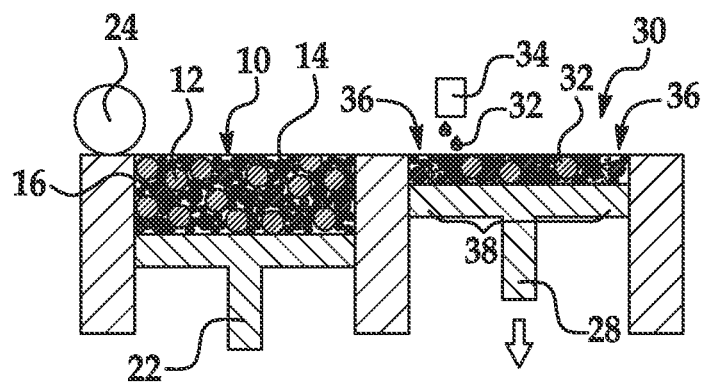

After pre-heating the layer 30, the coalescent agent 32 is selectively applied on at least a portion of the polymeric powder composition 10 in the layer 30, as shown in FIG. 3C. Examples of suitable coalescent agents 32 include water-based dispersions such as radiation absorbing binding agents. The radiation absorbing binding agents may be an infrared light absorber, a near infrared light absorber, or a visible light absorber. As one example, the coalescent agent 32 may be an ink-type formulation including carbon black, such as, for example, the ink formulation commercially known as CM997A available from Hewlett-Packard Company. Examples of inks including visible light enhancers are dye based colored ink and pigment based colored ink, such as the commercially available inks CE039A and CE042A, available from Hewlett-Packard Company.

As illustrated in FIG. 3C, the coalescent agent 32 may be dispensed from an inkjet printhead 34. While a single printhead is shown in FIG. 2C, it is to be understood that multiple printheads may be used that span the width of the fabrication bed 26. The printhead 34 may be attached to a moving XY stage (not shown) that moves the printhead 34 adjacent to the fabrication bed 26 in order to deposit the coalescent agent 32 in desirable area(s) 38. The printhead 34 may be programmed to receive commands from the central processing unit and to deposit the coalescent agent 32 according to a pattern for the first layer of the 3D object. The printhead 34 selectively applies the coalescent agent 32 on those portions of the layer 30 that are to be fused to become the first layer of the 3D object. As an example, if the first layer is to be shaped like a cube or cylinder, the coalescent agent 32 will be deposited in a square pattern or a circular pattern (from a top view), respectively, on at least a portion of the layer 30 of the polymeric powder composition 10. In the example shown in FIG. 3C, the coalescent agent 32 is deposited, e.g., in a square pattern on the area 38 of the layer 30 and not on the areas 36.

The aqueous nature of the coalescent agent 32 enables the coalescent agent 32 to penetrate, at least partially, into the polymeric powder composition layer 30.

Figure 3D:
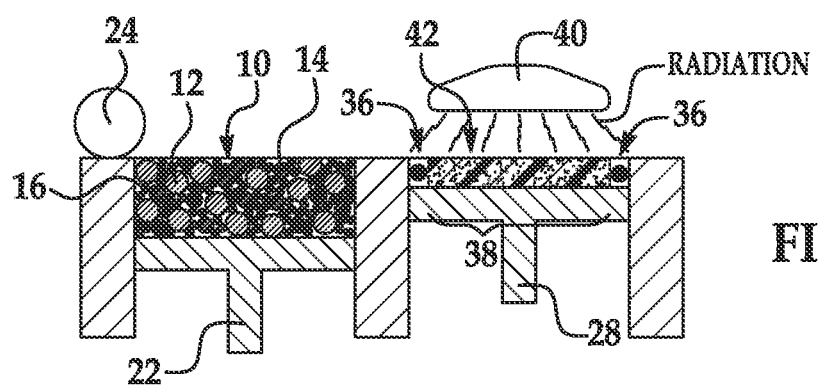

After the coalescent agent 32 is/are selectively applied in the desired area(s) 38, the entire layer 30 of the polymeric powder composition 10 and the coalescent agent 32 applied to at least a portion thereof are exposed to radiation. This is shown in FIG. 3D.

The radiation is emitted from a radiation source 40, such as an IR, near-IR, UV, or visible curing lamp, IR, near-IR, UV, or visible light emitting diodes (LED), or lasers with specific wavelengths. The radiation source 40 used will depend, at least in part, on the type of coalescent agent 32 that is used. The radiation source 40 may be attached, for example, to a carriage that also holds the printhead(s) 34. The carriage may move the radiation source 40 into a position that is adjacent to the fabrication bed 26. The radiation source 40 may be programmed to receive commands from the central processing unit and to expose the layer 30 and coalescent agent 32 to radiation. The length of time the radiation is applied for, or energy exposure time, may be dependent, for example, on one or more of: characteristics of the radiation source 40; characteristics of the polymeric power material 10; and/or characteristics of the coalescent agent 32.

The coalescent agent 32 enhances the absorption of the radiation, converts the absorbed radiation to thermal energy, and promotes the transfer of the thermal heat to the polymeric powder composition 10 in contact therewith (i.e., in the area 38). In an example, the coalescent agent 32 sufficiently elevates the temperature of the polymeric powder composition 10 in the area 38 above the melting point(s), allowing curing (e.g., sintering, binding, fusing, etc.) of the particles 12, 14, 16 to take place. The coalescent agent 32 may also cause, for example, heating of the polymeric powder composition 10 below its melting point but to a temperature suitable to cause softening and bonding of the particles 12, 14, 16. It is to be understood that area(s) 36 not having the coalescent agent 32 applied thereto absorb less energy, and thus the polymeric powder composition 10 within these area(s) 36 generally does not exceed the melting point(s) of the particles 12, 14, 14 and does not cure. This forms one layer 42 of the 3D object 44 (see FIG. 3E) to be formed.

The steps shown and described in reference to FIGS. 3A through 3D may be repeated as many times as desirable to create subsequent layers 46, 48, 50 (FIG. 3E) and to ultimately form the 3D object 44. It is to be understood that heat absorbed during the application of energy from a portion of the polymeric powder composition 10 on which coalescent agent 32 has been delivered or has penetrated may propagate to a previously solidified layer, such as layer 42, causing at least some of that layer to heat up above its melting point. This effect helps create strong interlayer bonding between adjacent layers of the 3D object 44.

Figure 3E:
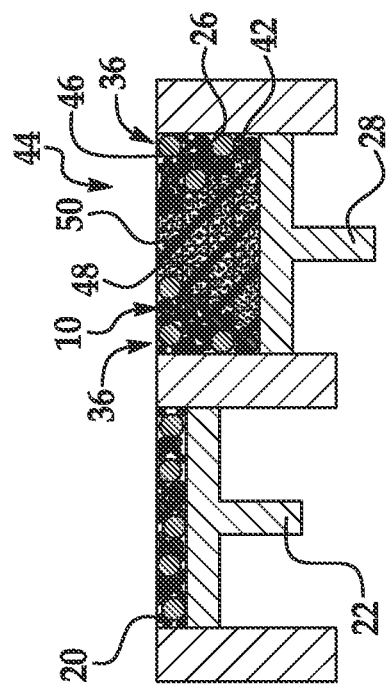

FIG. 3E illustrates one example of the 3D object 44. It is to be understood, however, that the subsequently formed layers 46, 48, 50 may have any desirable shape and/or thickness and may be the same as or different from any other layer 42, 46, 48, 50 depending upon the size, shape, etc. of the 3D object 44 that is to be formed.

As illustrated in FIG. 3E, as subsequent layers 46, 48, 50 have been formed, the delivery piston 22 is pushed closer to the opening of the delivery bed 20, and the supply of the polymeric powder composition 10 in the delivery bed 20 is diminished (compared, for example, to FIG. 3A at the outset of the method). The fabrication piston 28 is pushed further away from the opening of the fabrication bed 26 in order to accommodate the subsequent layer(s) of polymeric powder composition 10 and selectively applied coalescent agent 32. Since at least some of the polymeric powder composition 10 remains uncured after each layer 42, 46, 48, 50 is formed, the 3D object 44 is at least partially surrounded by the uncured polymeric powder composition 10 in the fabrication bed 26.

When the 3D object 44 is complete, it may be removed from the fabrication bed, and the uncured polymeric powder composition 10 remaining in the fabrication bed 26 may be reused.

Figure 4:
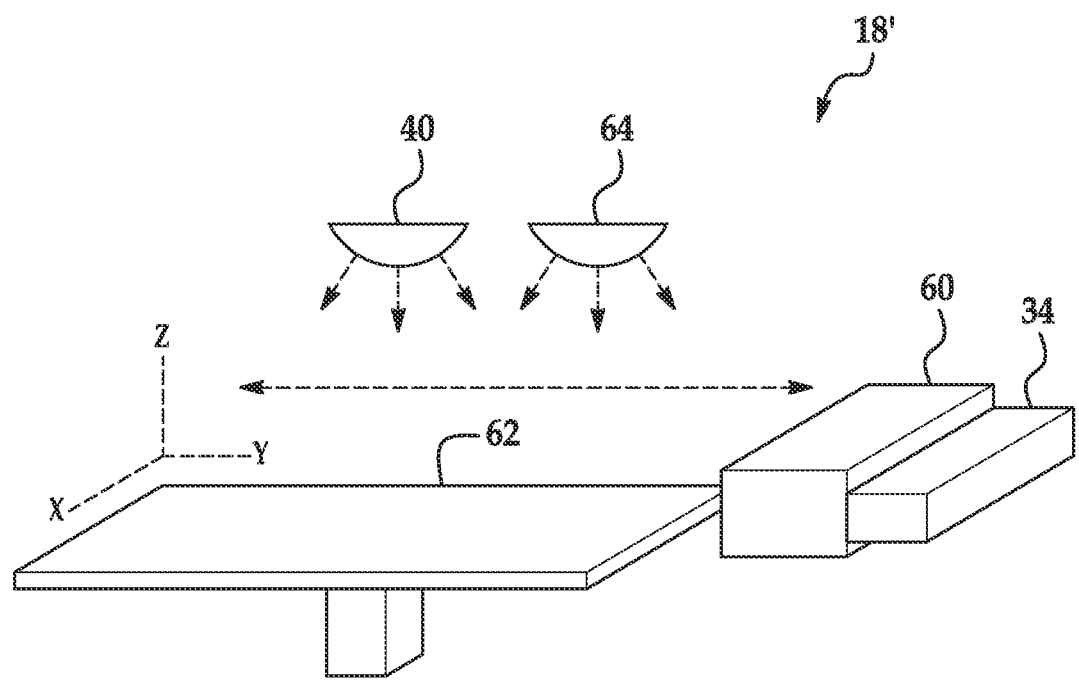
FIG. 4 is a simplified isometric view of an example of a 3D printing system that may be used in an example of the 3D printing method as disclosed herein.
Figure 4:
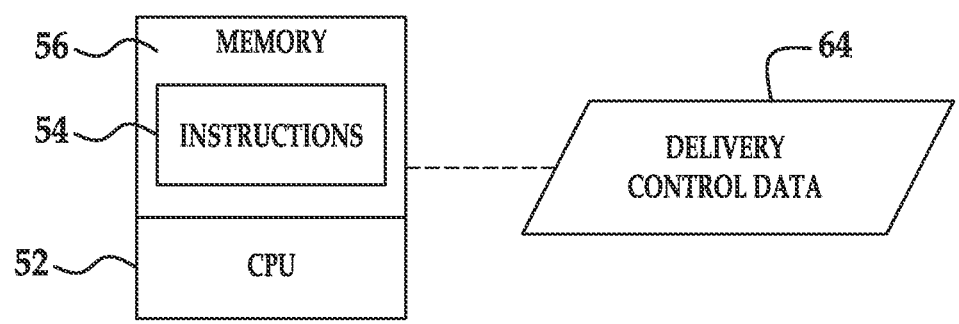

Referring now to FIG. 4, another example of the printing system 18' is depicted. The system 18' includes a central processing unit 52 that controls the general operation of the additive printing system 18'. As an example, the central processing unit 52 may be a microprocessor-based controller that is coupled to a memory 56, for example via a communications bus (not shown). The memory 56 stores the computer readable instructions 54. The central processing unit 52 may execute the instructions 54, and thus may control operation of the system 18' in accordance with the instructions 54.

In this example, the printing system 18' includes a coalescent agent distributor 34 to selectively deliver coalescent agent 32 to a layer (not shown in this figure) of polymeric particle composition 10 provided on a support member 62. In an example, the support member 62 has dimensions ranging from about 10 cm by 10 cm up to about 100 cm by 100 cm, although the support member 62 may have larger or smaller dimensions depending upon the 3D object 44 that is to be formed.

The central processing unit 52 controls the selective delivery of the coalescent agent 32 to the layer of the polymeric particle composition 10 in accordance with delivery control data 64.

In the example shown in FIG. 4, it is to be understood that the distributor 34 is a printhead, such as a thermal printhead or a piezoelectric inkjet printhead. The printheads 34 may be a drop-on-demand printhead or a continuous drop printhead.

The printhead 34 may be used to selectively deliver the coalescent agent 32 when in the form of a suitable fluid. As such, in some example, the coalescent agent 32 may include a liquid carrier, such as water and/or any other suitable solvent and/or dispersant, to enable it to be delivered via the printhead 34

In one example, the printhead 34 may be selected to deliver drops of the coalescent agent 32 at a resolution ranging from about 300 dots per inch (DPI) to about 1200 DPI. In other examples, the printhead 34 may be selected to be able to deliver drops of the coalescent agent 32 at a higher or lower resolution.

The printhead 34 may include an array of nozzles through which the printhead 34 is able to selectively eject drops of fluid. In one example, each drop may be in the order of about 10 pico liters (pl) per drop, although it is contemplated that a higher or lower drop size may be used. In some examples, printhead 34 is able to deliver variable size drops.

The printhead 34 may be an integral part of the printing system 18', or they may be user replaceable. When the printhead 34 is user replaceable, it may be removably insertable into a suitable distributor receiver or interface module (not shown).

In another example of the printing system 18', a single inkjet printhead may be used to selectively deliver different types of the coalescent agent 32. For example, a first set of printhead nozzles of the printhead may be configured to deliver one type of coalescent agent 32, and a second set of printhead nozzles of the printhead may be configured to deliver another type of coalescent agent 32.

As shown in FIG. 4, the distributor 34 has a length that enables it to span the whole width of the support member 62 in a page-wide array configuration. In an example, the page-wide array configuration is achieved through a suitable arrangement of multiple printheads. In another example, the page-wide array configuration is achieved through a single printhead with an array of nozzles having a length to enable it to span the width of the support member 62. In other examples of the printing system 18', the distributor 34 may have a shorter length that does not enable it to span the whole width of the support member 62.

While not shown in FIG. 4, it is to be understood that the distributor 34 may be mounted on a moveable carriage to enable it to move bi-directionally across the length of the support member 62 along the illustrated y-axis. This enables selective delivery of the coalescent agent 32 across the whole width and length of the support member 62 in a single pass. In other examples, the distributor 34 may be fixed while the support member 62 is configured to move relative thereto.

As used herein, the term 'width' generally denotes the shortest dimension in the plane parallel to the x and y axes shown in FIG. 4, and the term 'length' denotes the longest dimension in this plane. However, it is to be understood that in other examples the term 'width' may be interchangeable with the term 'length'. As an example, the distributor 34 may have a length that enables it to span the whole length of the support member 62 while the moveable carriage may move bi-directionally across the width of the support member 62.

In examples in which the distributor 34 has a shorter length that does not enable them to span the whole width of the support member 62, the distributor 34 may also be movable bi-directionally across the width of the support member 62 in the illustrated x-axis. This configuration enables selective delivery of the coalescent agent 32 across the whole width and length of the support member 62 using multiple passes.

The distributor 34 may include therein a supply of the coalescent agent 32, or may be operatively connected to a separate supply of the coalescent agent 32.

As shown in FIG. 4, the printing system 18' also includes a polymeric powder composition distributor 60. This distributor 60 is used to provide the layer (e.g., layer 30) of the polymeric powder composition 10 on the support member 62. Suitable polymeric powder composition distributors 60 may include, for example, a wiper blade and a roller.

The polymeric powder composition 10 may be supplied to the polymeric powder composition distributor 60 from a hopper or other suitable delivery system. In the example shown, the polymeric powder composition distributor 60 moves across the length (y-axis) of the support member 62 to deposit a layer of the polymeric powder composition 10. As previously described, a first layer of polymeric powder composition 10 will be deposited on the support member 62, whereas subsequent layers of the polymeric powder composition 10 will be deposited on a previously deposited (and solidified) layer.

It is to be further understood that the support member 62 may also be moveable along the z-axis. In an example, the support member 62 is moved in the z-direction such that as new layers of polymeric powder composition 10 are deposited, a predetermined gap is maintained between the surface of the most recently formed layer and the lower surface of the distributor 34. In other examples, however, the support member 62 may be fixed along the z-axis and the distributor 34 may be movable along the z-axis.

Similar to the system 18, the system 18' also includes the radiation source 40 to apply energy to the deposited layer of polymeric powder material 10 and the coalescent agent 32 to cause the solidification of portion(s) 38 of the polymeric powder material 10. Any of the previously described radiation sources 40 may be used. In an example, the radiation source 40 is a single energy source that is able to uniformly apply energy to the deposited materials, and in another example, radiation source 40 includes an array of energy sources to uniformly apply energy to the deposited materials.

In the examples disclosed herein, the radiation source 40 is configured to apply energy in a substantially uniform manner to the whole surface of the deposited polymeric powder composition 10. This type of radiation source 40 may be referred to as an unfocused energy source. Exposing the entire layer to energy simultaneously may help increase the speed at which a three-dimensional object may be generated.

While not shown, it is to be understood that the radiation source 40 may be mounted on the moveable carriage or may be in a fixed position.

The central processing unit 52 may control the radiation source 40. The amount of energy applied may be in accordance with delivery control data 64.

The system 18' may also include a pre-heater 64 that is used to pre-heat the deposited polymeric powder material 10 (as shown and described in reference to FIG. 3B). The use of the pre-heater 64 may help reduce the amount of energy that has to be applied by the radiation source 40.

To further illustrate the present disclosure, an example is given herein. It is to be understood that this example is provided for illustrative purposes and is not to be construed as limiting the scope of the disclosed example(s).

EXAMPLE

The computational modeling method disclosed herein was used to design a tri-modal powder formulation. In the computational model, three polyamide 12 powder materials with the intrinsic properties shown in Table 3 were used. As shown in Table 23, the average particle sizes used were 60 µm (PA-12_1), 20 µm (PA-12_2), and 9 µm (PA-12_3). The ratio of the three powders used in this example of the computational modeling is also shown in Table 3. The particle sizes and ratio were used as input parameters to calculate the optimum packing density for the tri-model powder formulation.

TABLE 3

| Polymer particle ID | Melting Point (Major) (° C.) | Melting Point (Minor) (° C.) | Crystallization Temp (° C.) | Avg. Particle Size (µm) | Wt % |
| --- | --- | --- | --- | --- | --- |
| PA-12_1 | 178 | 169 | 148 | 60 | 91 |
| PA-12_2 | 177 | 167 | 147 | 20 | 8.5 |
| PA-12_3 | 178 | 170 | 151 | 9 | 0.5 |

Figure 5:
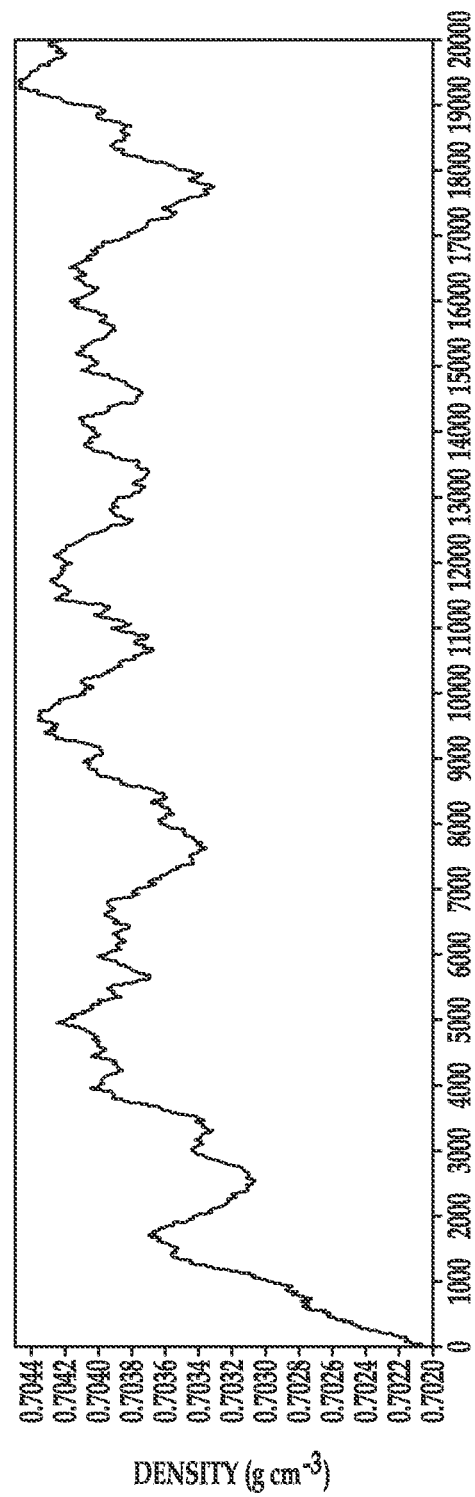
FIG. 5 is a graph of the density profile along a simulation time for a simulation cell of a polymeric powder composition including differently sized polyamide 12 particles.

FIG. 5 illustrates the density profile along the simulation time for the simulation cell generated from the information in Table 3. During the dynamics simulation, all of the polymer particles move, and the dimension of the simulation cell changes. Therefore, the density of the simulation system changes along the simulation time.

The polymeric powder composition (using the size distribution and ratio shown in Table 3) was then prepared as a dry powder. The tapped density of the polymeric powder composition was about 0.52 g/ml. The tapped density was measured by tapping the composition into a volumetric tube to its lowest volume. The sample weight and the volume after tapping were used to calculate the tapped density.

The polymeric powder composition was used to print a 3D object using an example of the method described in accordance with FIGS. 3A through 3E. A commercially available polyamide 12 (i.e., PA2200) having a size distribution with different sized particles was printed as a comparative example, using the same printing conditions that were used for the polymeric powder composition. The printing conditions included 20 ips with ink density of 25%.

Figure 6A:
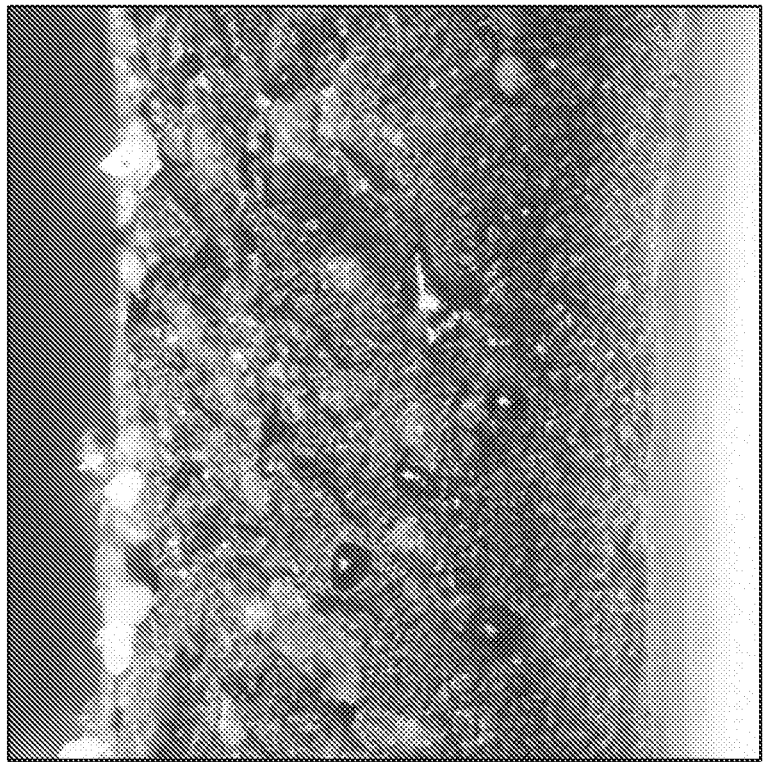
FIG. 6A is a cross-sectional optical micrograph of an example 3D printed object printed with an example of the polymeric powder composition disclosed herein.
Figure 6B:
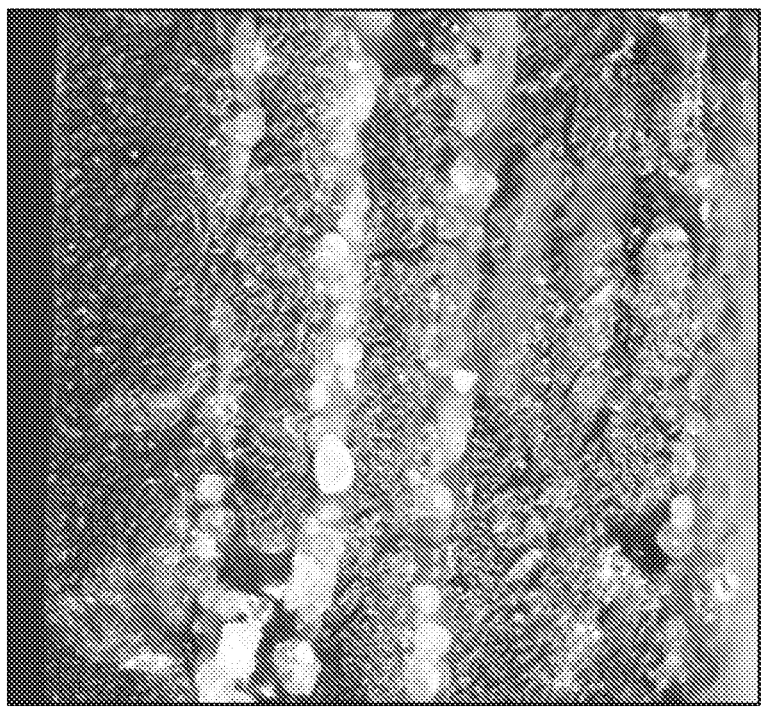
FIG. 6B is a cross-sectional optical micrograph of a comparative example 3D printed object printed with polyamide 12.

Optical micrographs of cross-sectional views of the printed 3D object and the comparative printed 3D object are shown in FIGS. 6A and 6B respectively. As illustrated by comparing FIGS. 6A and 6B, the polymeric powder composition disclosed herein results in more complete melting and fusing within and between layers than the comparative polyamide 12. The bright, substantially vertical lines in FIG. 6B show where only partial fusing occurred within and between layers of the comparative composition.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 50° C. to about 350° C. should be interpreted to include not only the explicitly recited limits of about 50° C. to about 350° C., but also to include individual values, such as 57° C., 95° C., 125° C., 250° C., etc., and sub-ranges, such as from about 70° C. to about 225° C., from about 60° C. to about 170° C., etc. Furthermore, when "about" is utilized to describe a value, this is meant to encompass minor variations (up to +/−10%) from the stated value.

In describing and claiming the examples disclosed herein, the singular forms "a", "an", and "the" include plural referents unless the context clearly dictates otherwise.

While several examples have been described in detail, it will be apparent to those skilled in the art that the disclosed examples may be modified. Therefore, the foregoing description is to be considered non-limiting.

What is claimed is:

1. A polymeric powder composition for three-dimensional printing, the polymeric powder composition comprising:
   a first polymer particle of a first average size and present in an amount ranging from about 70 wt % to about 95 wt %;
   a second polymer particle of a second average size and present in an amount ranging from about 0.5 wt % to about 21 wt %, the second average size being smaller than the first average size; and
   a third polymer particle of a third average size and present in an amount ranging from greater than 0 wt % up to about 21 wt %, the third average size being smaller than the second average size;
   wherein:
      each of the first average size, the second average size, and the third average size independently ranges from 5 μm to about 100 μm;
      a sum of fractional weight ratios of all polymer particles in the polymeric powder composition equals 1;
      the polymeric powder composition has a computationally predetermined packing density;
      the first average size ranges from 50 μm to 100 μm, and the first polymer particle has a weight average molecular weight ranging from about 25,000 to about 300,000;
      the second average size ranges from 20 μm to less than 50 μm, and the second polymer particle has a weight average molecular weight ranging from about 25,000 to about 300,000; and
      the third average size ranges from 5 μm to less than 20 μm, and the third polymer particle has a weight average molecular weight ranging from about 25,000 to about 300,000.

2. The polymeric powder composition as defined in claim 1, further comprising a charging agent, a flow aid, or combinations thereof.

3. The polymeric powder composition as defined in claim 1 wherein the computationally predetermined packing density ranges from about 0.4 g/ml to about 0.9 g/ml.

4. A polymeric powder composition for three-dimensional printing, the polymeric powder composition comprising:
   a first polymer particle of a first average size and present in an amount ranging from about 70 wt % to about 95 wt %;
   a second polymer particle of a second average size and present in an amount ranging from about 0.5 wt % to about 21 wt %, the second average size being smaller than the first average size; and
   a third polymer particle of a third average size and present in an amount ranging from greater than 0 wt % up to about 21 wt %, the third average size being smaller than the second average size;
   wherein:
      each of the first average size, the second average size, and the third average size independently ranges from 5 μm to about 100 μm;
      a sum of fractional weight ratios of all polymer particles in the polymeric powder composition equals 1;
      the polymeric powder composition has a computationally predetermined packing density; and
      each of the first polymer particle, the second polymer particle, and the third polymer particle includes:
         a core of a polymer having a weight average molecular weight ranging from 70,000 to about 300,000; and
         a shell of a polymer having a weight average molecular weight ranging from about 25,000 to less than 70,000.

5. The polymeric powder composition as defined in claim 4 wherein:
   the polymer having the weight average molecular weight ranging from 70,000 to about 300,000 is a high molecular weight polyamide 12; and
   the polymer having the weight average molecular weight ranging from about 25,000 to less than 70,000 is a low molecular weight polyamide 12.

6. The polymeric powder composition as defined in claim 4 wherein:
   the polymer having the weight average molecular weight ranging from 70,000 to about 300,000 is a high molecular weight nylon selected from the group consisting of polyamide 6, polyamide 8, polyamide 11, and polyamide 66; and
   the polymer having the weight average molecular weight ranging from about 25,000 to less than 70,000 is a low molecular weight polyamide 12.

7. A polymeric powder composition for three-dimensional printing, the polymeric powder composition comprising:
   a first polymer particle of a first average size and present in an amount ranging from about 70 wt % to about 95 wt %;
   a second polymer particle of a second average size and present in an amount ranging from about 0.5 wt % to about 21 wt %, the second average size being smaller than the first average size; and
   a third polymer particle of a third average size and present in an amount ranging from greater than 0 wt % up to about 21 wt %, the third average size being smaller than the second average size;
   wherein:
      each of the first average size, the second average size, and the third average size independently ranges from 5 μm to about 100 μm;
      a sum of fractional weight ratios of all polymer particles in the polymeric powder composition equals 1;
      the polymeric powder composition has a computationally predetermined packing density; and each of the first polymer particle, the second polymer particle, and the third polymer particle is chemically modified to include, at its surface:
   an amido group, a salt of a carboxylic acid functional group, or combinations thereof;
   an ester group; or
   a silane group.

8. A polymeric powder composition for three-dimensional printing, the polymeric powder composition comprising:
   a first polymer particle of a first average size and present in an amount ranging from about 70 wt % to about 95 wt %;
   a second polymer particle of a second average size and present in an amount ranging from about 0.5 wt % to about 21 wt %, the second average size being smaller than the first average size; and
   a third polymer particle of a third average size and present in an amount ranging from greater than 0 wt % up to about 21 wt %, the third average size being smaller than the second average size;
   wherein:
   each of the first average size, the second average size, and the third average size independently ranges from 5 µm to about 100 µm;
   a sum of fractional weight ratios of all polymer particles in the polymeric powder composition equals 1;
   the polymeric powder composition has a computationally predetermined packing density; and
   each of the first polymer particle, the second polymer particle, and the third polymer particle has a nodular surface morphology including a plurality of nodules, each nodule having a diameter ranging from about 50 nm to about 5 µm.

9. A three-dimensional (3D) printing method, comprising:
   depositing a polymeric powder composition, including:
      a first polymer particle of a first average size and present in an amount ranging from about 70 wt % to about 95 wt %;
      a second polymer particle of a second average size and present in an amount ranging from about 0.5 wt % to about 21 wt %, the second average size being smaller than the first average size; and
      a third polymer particle of a third average size and present in an amount ranging from greater than 0 wt % to about 21 wt %, the third average size being smaller than the second average size;
      wherein each of the first average size, the second average size, and the third average size independently ranges from 5 µm to about 100 µm, a sum of fractional weight ratios of all polymer particles in the polymeric powder composition equals 1, and the polymeric powder composition has a computationally predetermined packing density, and wherein:
         the first average size ranges from 50 µm to 100 µm, and the first polymer particle has a weight average molecular weight ranging from about 25,000 to about 300,000;
         the second average size ranges from 20 µm to less than 50 µm, and the second polymer particle has a weight average molecular weight ranging from about 25,000 to about 300,000; and
         the third average size ranges from 5 µm to less than 20 µm, and the third polymer particle has a weight average molecular weight ranging from about 25,000 to about 300,000;
   heating the polymeric powder composition to a temperature ranging from about 50° C. to about 350° C.;
   selectively applying a coalescent agent on at least a portion of the polymeric powder composition; and
   exposing the polymeric powder composition and the coalescent agent to radiation, whereby the coalescent agent absorbs the radiation and converts the absorbed radiation to thermal energy, thereby at least curing the at least the portion of the polymeric powder composition in contact with the coalescent agent and forming a first layer of a three-dimensional object.

10. The 3D printing method as defined in claim 9, further comprising:
   depositing a second layer of the polymeric powder composition on the first layer of the three-dimensional object;
   heating the second layer of the polymeric powder composition to a temperature ranging from about 50° C. to about 350° C.;
   selectively applying a second layer of the coalescent agent on at least a portion of the second layer of the polymeric powder composition; and
   exposing the second layer of the polymeric powder composition and the second layer of the coalescent agent to radiation, whereby the coalescent agent in the second layer absorbs the radiation and converts the absorbed radiation to thermal energy, thereby at least curing the at least the portion of the second layer of the polymeric powder composition in contact with the coalescent agent of the second layer of the coalescent dispersion and forming a second layer of the three-dimensional object.

* * * * *